(12) United States Patent
Humphrey et al.

(10) Patent No.: US 10,680,843 B2
(45) Date of Patent: Jun. 9, 2020

(54) NETWORK NODE

(71) Applicant: British Telecommunications Public Limited Company, London (GB)

(72) Inventors: Leslie Humphrey, London (GB); Ian Horsley, London (GB); Ian Cooper, London (GB); Trevor Linney, London (GB); Trevor Morsman, London (GB)

(73) Assignee: British Telecommunications Public Limited Company, London (GB)

( * ) Notice: Subject to any disclaimer, the term of this patent is extended or adjusted under 35 U.S.C. 154(b) by 0 days.

(21) Appl. No.: 16/472,376

(22) PCT Filed: Dec. 20, 2017

(86) PCT No.: PCT/EP2017/083943
§ 371 (c)(1),
(2) Date: Jun. 21, 2019

(87) PCT Pub. No.: WO2018/115196
PCT Pub. Date: Jun. 28, 2018

(65) Prior Publication Data
US 2019/0363900 A1 Nov. 28, 2019

(30) Foreign Application Priority Data
Dec. 21, 2016 (EP) .................................... 16205782

(51) Int. Cl.
*H04L 12/28* (2006.01)
*H04B 10/25* (2013.01)
*H05K 7/20* (2006.01)

(52) U.S. Cl.
CPC ......... *H04L 12/2801* (2013.01); *H04B 10/25* (2013.01); *H05K 7/209* (2013.01); *H05K 7/20336* (2013.01); *H05K 7/20936* (2013.01)

(58) Field of Classification Search
CPC ............... H05K 7/20336; H05K 7/209; H05K 7/20936; H04B 10/25; H02L 12/2801
See application file for complete search history.

(56) References Cited

U.S. PATENT DOCUMENTS 6,204,945 B1 3/2001 Iwata et al.
6,529,479 B1 3/2003 Suzuki
(Continued)

FOREIGN PATENT DOCUMENTS

EP 2 140 675 A1 1/2010
EP 2209325 7/2010
(Continued)

OTHER PUBLICATIONS

Written Opinion and International Search Report for Application No. PCT/EP2017/083943, filed Dec. 20, 2017 (10 pgs).
(Continued)

*Primary Examiner* — Thomas A Hollweg
*Assistant Examiner* — Mary A El-Shammaa
(74) *Attorney, Agent, or Firm* — Patterson Thuente Pedersen, P.A.

(57) ABSTRACT

A network node for use in a hybrid fiber-copper access network, wherein the node includes DSL and reverse-power feed functionality. The node has a substantially cylindrical shape such that it receives an input metallic cable at a first end, an output metallic cable at a second end and an optical fiber cable which is received at a point along the body of the node.

6 Claims, 5 Drawing Sheets

(56) References Cited

U.S. PATENT DOCUMENTS

| | | | |
|---|---|---|---|
| 6,597,689 | B1 | 7/2003 | Chiu et al. |
| 7,295,621 | B2 | 11/2007 | Verbin et al. |
| 7,330,516 | B2 | 2/2008 | Cendrillon et al. |
| 7,496,135 | B2 | 2/2009 | Duvaut et al. |
| 7,564,932 | B2 | 7/2009 | Barak et al. |
| 8,000,219 | B2 | 8/2011 | Fang et al. |
| 8,121,126 | B1 | 2/2012 | Moisand |
| 8,582,976 | B2 | 11/2013 | Boyd |
| 8,588,285 | B2 | 11/2013 | Humphrey et al. |
| 8,681,897 | B2 | 3/2014 | Ginis et al. |
| 9,001,974 | B2 | 4/2015 | Humphrey |
| 9,300,815 | B2 | 3/2016 | Cooper |
| 9,628,283 | B2 | 4/2017 | Cooper |
| 9,667,436 | B2 | 5/2017 | Linney et al. |
| 9,800,739 | B2 | 5/2017 | Linney et al. |
| 10,110,755 | B2 | 10/2018 | Cooper et al. |
| 2002/0031113 | A1 | 3/2002 | Dodds et al. |
| 2002/0196793 | A1 | 12/2002 | Samba et al. |
| 2003/0108095 | A1 | 6/2003 | Duvaut et al. |
| 2003/0216143 | A1 | 11/2003 | Roese et al. |
| 2004/0086274 | A1 | 5/2004 | Wan et al. |
| 2006/0190570 | A1 | 8/2006 | Booth et al. |
| 2006/0228113 | A1 | 10/2006 | Cutillo et al. |
| 2009/0063689 | A1 | 3/2009 | Camille et al. |
| 2009/0092242 | A1 | 4/2009 | Cooke et al. |
| 2009/0263132 | A1 | 10/2009 | Rafel et al. |
| 2010/0131660 | A1 | 5/2010 | Dec et al. |
| 2010/0150556 | A1 | 6/2010 | Soto et al. |
| 2010/0180016 | A1 | 7/2010 | Bugwadia et al. |
| 2010/0182983 | A1 | 7/2010 | Herscovici et al. |
| 2010/0202441 | A1 | 8/2010 | Haag |
| 2010/0223164 | A1 | 9/2010 | Fortier et al. |
| 2012/0122424 | A1 | 5/2012 | Herscovici et al. |
| 2014/0245405 | A1 | 8/2014 | Ye et al. |
| 2015/0263809 | A1* | 9/2015 | Gupta ............... H04B 10/25 398/66 |
| 2015/0327184 | A1 | 11/2015 | Beattie et al. |
| 2016/0204956 | A1 | 7/2016 | Linney |
| 2016/0241452 | A1 | 8/2016 | Ringland et al. |
| 2018/0025299 | A1* | 1/2018 | Kumar ............... G06F 3/0683 709/224 |

FOREIGN PATENT DOCUMENTS

| | | |
|---|---|---|
| EP | 2362626 | 8/2011 |
| EP | 2451119 | 5/2012 |
| EP | 2536068 | 12/2012 |
| EP | 2624507 | 8/2013 |
| GB | 2383919 | 7/2003 |
| GB | 2503310 | 12/2013 |
| GB | 2542807 | 4/2017 |
| JP | S58 206198 A | 12/1983 |
| WO | WO2007140337 | 12/2007 |
| WO | WO 2009/009219 | 1/2009 |
| WO | WO2009/138710 | 11/2009 |
| WO | WO2009/138711 | 11/2009 |
| WO | WO2010/082016 | 7/2010 |
| WO | WO2012/032309 | 3/2012 |
| WO | WO2012/069788 | 5/2012 |
| WO | WO2015033091 | 3/2015 |
| WO | WO 2015/066327 | 5/2015 |
| WO | WO2015132562 | 9/2015 |

OTHER PUBLICATIONS

Application and File history for U.S. Appl. No. 14/907,183, filed Jun. 5, 2014, Inventor: Cooper.
Application and File history for U.S. Appl. No. 14/916,829, filed Sep. 4, 2014, Inventors: Linney et al.
Application and File history for U.S. Appl. No. 15/318,492, filed Jul. 3, 2015, Inventors: Linney et al.
International Search Report for PCT/GB2014/000214, dated Aug. 5, 2014, 3 pages.
European Search Report, Application No. EP 13250085, dated Jan. 7, 2014, 2 pages.
Alcatel-Lucent, "Reverse power feed start-up protocol," European Telecommunications Standards Institute (ETSI) (Aug. 23, 2013), XP014157965; pp. 1-4.
BT Group PLC, "Reverse power feed state machine for start-up," European Telecommunications Standards Institute (ETSI) (Feb. 27, 2013), XP014156153; pp. 1-2.
Extended European Search Report for corresponding EP App No. 13250132.1 dated May 19, 2014; 6 pages.
International Search Report for corresponding International Application No. PCT/GB2014/000527 dated Mar. 9, 2015; 3 pages.
Written Opinion for corresponding International Application No. PCT/GB2014/000527 dated Mar. 9, 2015; 5 pages.
PCT Written Opinion of the International Search Authority for PCT/GB2014/000214, dated Jun. 17, 2015, 5 pages.
Route Des Lucioles, "Access, Terminals, Transmission and Multiplexing (ATTM): European Requirements for Reverse Powering of Remote Access Equipment Part 1 Architecture", ETSI Draft; Rev Powering Architecture, European Telecommunications Standards Institute (ETSI), 650; F-06921 Sophia-Antipolis; France, No. V1.1.1, Jan. 19, 2011 (Jan. 19, 2011) 30 pages, XP014062355.
International Search Report and Written Opinion, for PCT Application No. PCT/GB2014/000390, dated Dec. 22, 2014, 10 pages.
International Preliminary Report on Patentability for PCT Application No. PCT/GB2014/000349, dated Dec. 11, 2015, 12 pages.
Mitton, Networking Working Group, "Network Access Server Requirements Next Generation (NASREQNG) NAS Model," Jul. 2000, 20 pages.
International Search Report for PCT/GB2014/000349, dated Nov. 10, 2014, 4 pages.
Written Opinion of the International Searching Authority for PCT/GB2013/000339, dated Nov. 10, 2014, 6 pages.
International Preliminary Report on Patentability for PCT/GB2013/000339, dated Feb. 9, 2016, 7 pages.
Bitar N et al., "Applicability of the Access Node Control Mechanism to Broadband Networks Based on Passive Optical Networks (PONs); rfc6934. Txt", Applicability of the Access Node Control Mechanism to Broadband Networks Based on Passive Optical Networks (PONS); RFC6934.TXT, Internet Engineering Task Force, IETF; Standard, Internet Society (ISOC) 4, Rue Des Falaises CH-1205 Geneva, Switzerland, Jun. 18, 2013 (Jun. 18, 2013), pp. 1-39, XP015095007.
Access Node Control Protocol (ancp), https://datatracker.ieft.org/wg/ancp/charter/, Feb. 25, 2016, 5 pages.
S. Ooghe et al., "Framework and Requirements for an Access Node Control Mechanism in Broadband Multi-Service Networks", RFC 5851 ANCP Framework, May 2010, 47 pages.
S. Wadhwa et al., "Protocol for Access Node Control Mechanism in Broadband Networks Abstract" RFC 6320 ANCP Framework, Oct. 2011, 82 pages.
N. Bitar et al., "Applicability of the Access Node Control Mechanism to Broadband Networks Based on Passive Optical Networks (PONs)", RFC 6934 ANCP in PON-Based Networks, Jun. 2013, 39 pages.
Welch et al., Broadband Forum Technical Report, "TR-207 Layer 2 Control Mechanism for Broadband Multi-Service Architectures part II", TR-207 Issue 1, Nov. 2012, 38 pages.
International Search Report for corresponding International Application No. PCT/EP2015/065248 dated Oct. 9, 2015; 4 pages.
Written Opinion of the International Searching Authority for corresponding International Application No. PCT/EP2015/065248, dated Oct. 9, 2015, 6 pages.
Extended European Search Report for corresponding EP Application No. 14179207.7 dated Jan. 16, 2015; 8 pages.
Rapporteur "G.hn: Updated Issues List for continuing work on G.hn", ITU-T Draft; Study Period 2013-2016, International Telecommunication Union, Geneva, CH; vol. 18/15, Apr. 19, 2013, XP017580284; pp. 61.
"Fast access to subscriber terminals (FAST)—Power spectral density specification," Sep. 12, 2016, 19 pages.
"Access, Terminals, Transmission and Multiplexing (ATTM): European Requirements for Reverse Powering of Remote Access Equip- (56) References Cited

OTHER PUBLICATIONS ment Part 1 Architecture", ETSI TS 101548, European Telecommunications Standards Institute (ETSI), 650, Route Des Lucioles; F-06921 Sophia-Antipolis; France, No. V1.1.1, Sep. 2014, pp. 30.
Great Britain Combined Search and Examination Report, Application No. GB1621857.0, dated Jun. 8, 2017, 6 pages.

* cited by examiner

NETWORK NODE

CROSS-REFERENCE TO RELATED APPLICATION

The present application is a National Phase entry of PCT Application No. PCT/EP2017/083943, filed Dec. 20, 2017, which claims priority from European Patent Application No. 16205782.2 filed Dec. 21, 2016, each of which is fully incorporated herein by reference.

TECHNICAL FIELD

The present disclosure relates to a node for use in communications networks, particularly for use in hybrid fiber-copper access networks.

BACKGROUND

Since the advent of the World Wide Web, there has been a need to provide internet access to customers at ever increasing data rates. Asymmetric Digital Subscriber Line (ADSL) technology over existing copper wires can provide data rates of up to 24 Mbit/s, but many customers will experience significantly lower data rates due to the length of the network connection. One solution is to install Fiber to the Premises (FTTP) networks, such as PONs (Passive Optical Networks), but this approach requires very significant investment.

Figure 1:
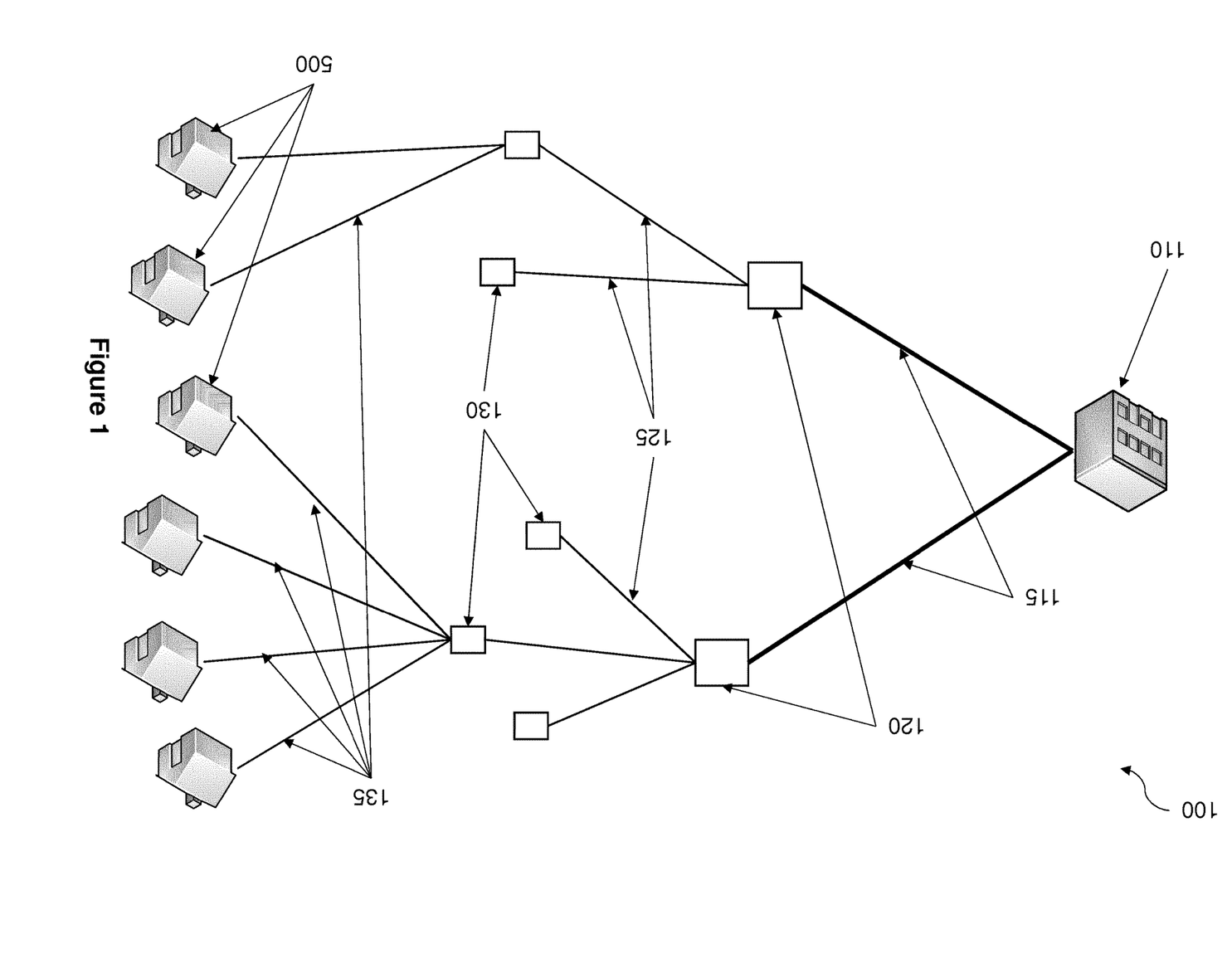
FIG. 1 shows a schematic depiction of a hybrid fiber-copper access network.

Another approach is to install limited amounts of optical fiber and to utilize it in conjunction with the legacy copper cabling. FIG. 1 shows a schematic depiction of a hybrid fiber-copper access network 100 in which a telephone exchange 110 is connected to a plurality of customer premises 500 (the customer premises may be domestic, commercial or industrial premises). One network architecture is Fiber to the Cabinet (FTTC, or FTTCab), in which the telephone exchange 100 is connected to cabinets 120 by optical fiber cable 115. VDSL (Very-high-bit-rate Digital Subscriber Line) data signals can be transmitted over the fiber cable to equipment in the cabinet which converts the optical signal to an electrical signal which can then be transmitted over a copper cable 125 to the customer premises 500. The customer premises are connected to the cabinet via a distribution point 130, which is typically located near to the customer premises, for example at a telephone pole. The distribution point is connected to the customer premises 500 using a dropwire 135, either via a telephone pole or via an underground connection, for example within a duct.

The VDSL2 technology commonly used with FTTC networks is typically able to deliver data rates of up to 80 Mbit/s downstream and up to 20 Mbit/s upstream (or even higher) although the data rate is dependent on the length of the copper cables between the customer premises and the cabinet and commercial choices made by the network operator. The use of G.fast transmission technology (which is an advanced DSL transmission format) with such networks should provide downstream data rates of 300 Mbit/s-1 Gbit/s, depending on the length of the copper cable connecting the cabinet to the customer premises.

A typical VDSL2 FTTC cabinet will be capable of receiving up to 6 line cards, each of which has 64 ports, so that the cabinet can support up to 384 customer premises connections. The cabinet needs to be located near to an existing PSTN telephony cabinet and to have an optical fiber connection to the exchange and an electrical power feed. Whilst such cabinets are effective in many suburban and urban areas, they are not appropriate for use in areas where there is a small number of customer premises or where a small number of customers cannot be served from existing cabinets. It is possible to use a smaller cabinet designed to serve a smaller number of customer lines but the fixed costs associated with providing and installing a cabinet mean that it can be uneconomic to provide a cabinet to serve only a small number of customers.

SUMMARY

According to a first aspect of the disclosure, there is provided a network node for deployment in an access network, the node having a substantially cylindrical shape and comprising: a first end configured to receive an input metallic cable; a second end configured to receive an output metallic cable; a port configured to receive an optical fiber cable, the port being located intermediate the first and the second end of the node; a power circuit configured, in use, to receive an electrical power supply from the output metallic cable; a digital subscriber line transceiver configured, in use, to receive optical data signals from the optical fiber cable and to transmit electrical data signals on the output metallic cable; and a heat sink which comprises heat pipe which extends along the length of the node. The network node may further comprise a fiber management apparatus, the apparatus being arranged around the periphery of the node.

An optical fiber cable can be supplied to an underground structure, such as a cable chamber or footway box, which is at an appropriate distance to serve a number of customers using a higher data-rate technology (such as VDSL or G.fast). A node according to the present disclosure can be fitted to an existing copper cable, which likely comprises 10 or 20 copper pairs, and the optical fiber cable is connected to the node. If a customer wishes to use the higher data-rate technology then an appropriate modem can be connected to the copper connection at the customer premises which sends an appropriate electrical power signal to the node to enable the activation of the digital subscriber line transceiver. Conventional telephony and/or ADSL services are provided to customer premises in a normal manner over the copper cables.

The use of such a network node greatly reduces the cost and simplifies the provision of higher bit-rate data services, using VDSL or G.fast technologies, as there is no need to build a cabinet or obtain an electrical power supply to operate the cabinet. Accordingly, the higher bit-rate data services can be provided to small groups of customers where previously it would not be economic to provide those services due to the cost of installing the cabinet, connecting to the existing network ducting, providing a power connection, etc. A node according to the present disclosure can be installed into an existing footway box, onto a telephone pole or directly buried into the ground, in a relatively simple manner.

According to a second aspect of the disclosure, there is provided a communications network comprising one or more nodes as described above.

BRIEF DESCRIPTION OF THE DRAWINGS

In order that the present disclosure may be better understood, embodiments thereof will now be described, by way of example only, with reference to the accompanying drawings in which.

DETAILED DESCRIPTION

Figure 2:
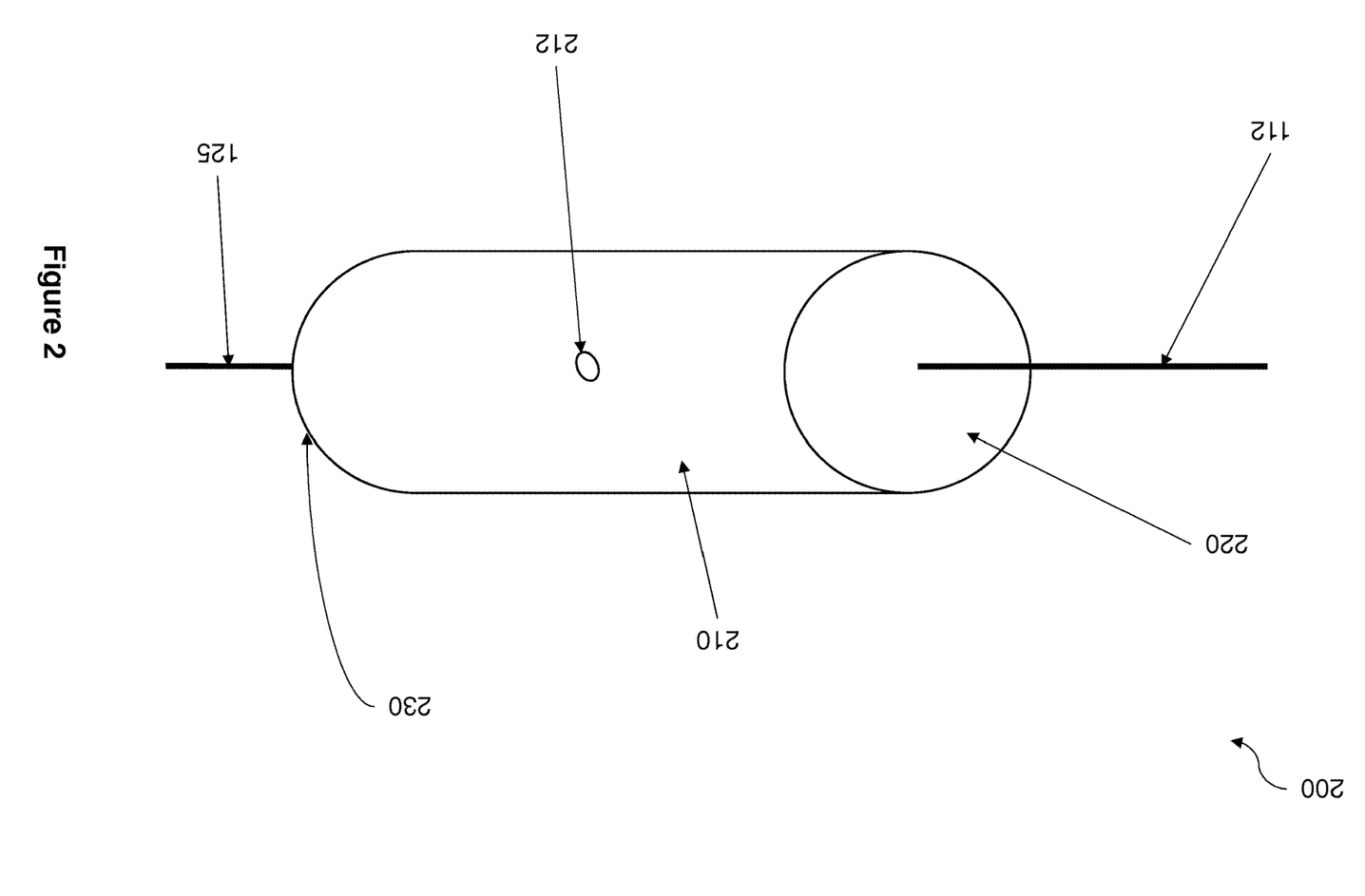
FIG. 2 shows a schematic external depiction of a network node according to the present disclosure.

FIG. 2 shows a schematic external depiction of a network node 200 according to the present disclosure. The network node 200 has a generally cylindrical form, comprising a longitudinal body 210, a first end face 220 and a second end face 230. A cable port 212 is formed in the body 210. An input metallic cable 112 is received at the first end face 220 and an output metallic cable 125 is received at the second end face 230. Typically the input and output metallic cables will comprise a small number of pairs of copper wires, for example 10 or 20 pairs. The opto-electronic circuitry required to perform the VDSL functionality will be stored within the network node and an optical fiber 115 will be received at the cable port 212.

Figure 3:
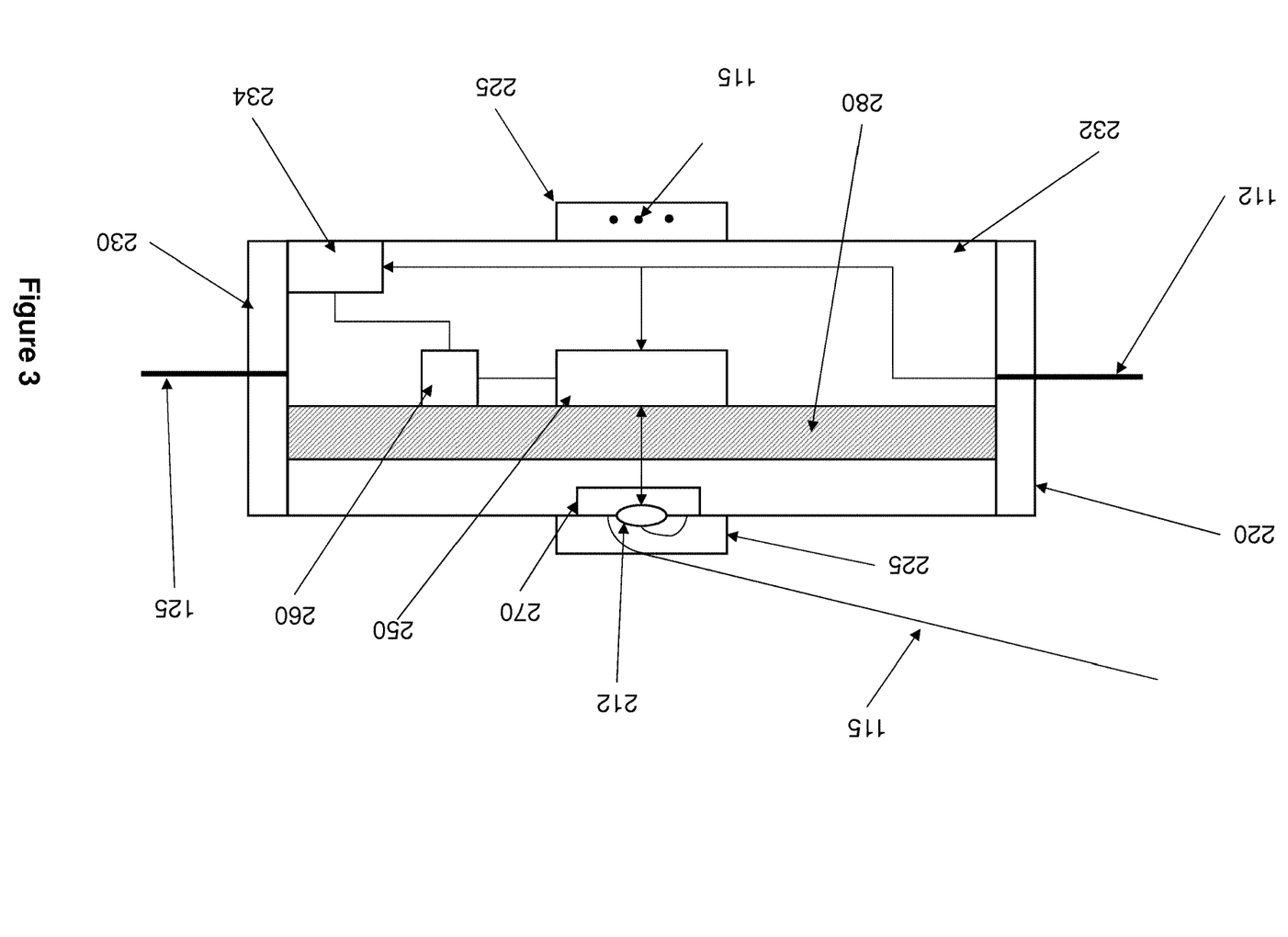
FIG. 3 shows a schematic depiction of a cross-section along the length of a network node according to the present disclosure.

FIG. 3 shows a schematic depiction of a cross-section along the length of a network node 200 according to the present disclosure. The input metallic cable 112 is received at the first end cap and the copper pairs are connected to a relay block 232 which is in turn connected to the output metallic cable 125. Optical cable 115 comprises one or more optical fibers and is received at the cable port 212 and connected to an optical terminator 270. Optical fiber management apparatus 225 is received around the external surface of the node so as to prevent environmental contamination of the network node and to allow the cable, and one or more optical fibers extracted from the cable to be stored in one or more loops around the curved surface of the node. The optical fiber management apparatus 225 also controls the optical fiber cable, and the optical fibers therein, from being bent beyond the minimum bend radius. A VDSL chipset 250 is configured to receive data from the optical terminator and to transmit data to the output metallic cable 125 via a set of output DSL ports (not shown). A reverse power feed (RPF) circuit 260 is connected to one or more of the copper pairs in the output metallic cable 125. Heat sink 280 is provided, and is preferably thermally coupled to one or more of the VDSL chipset 250 and the reverse power feed circuit 260.

Figure 4:
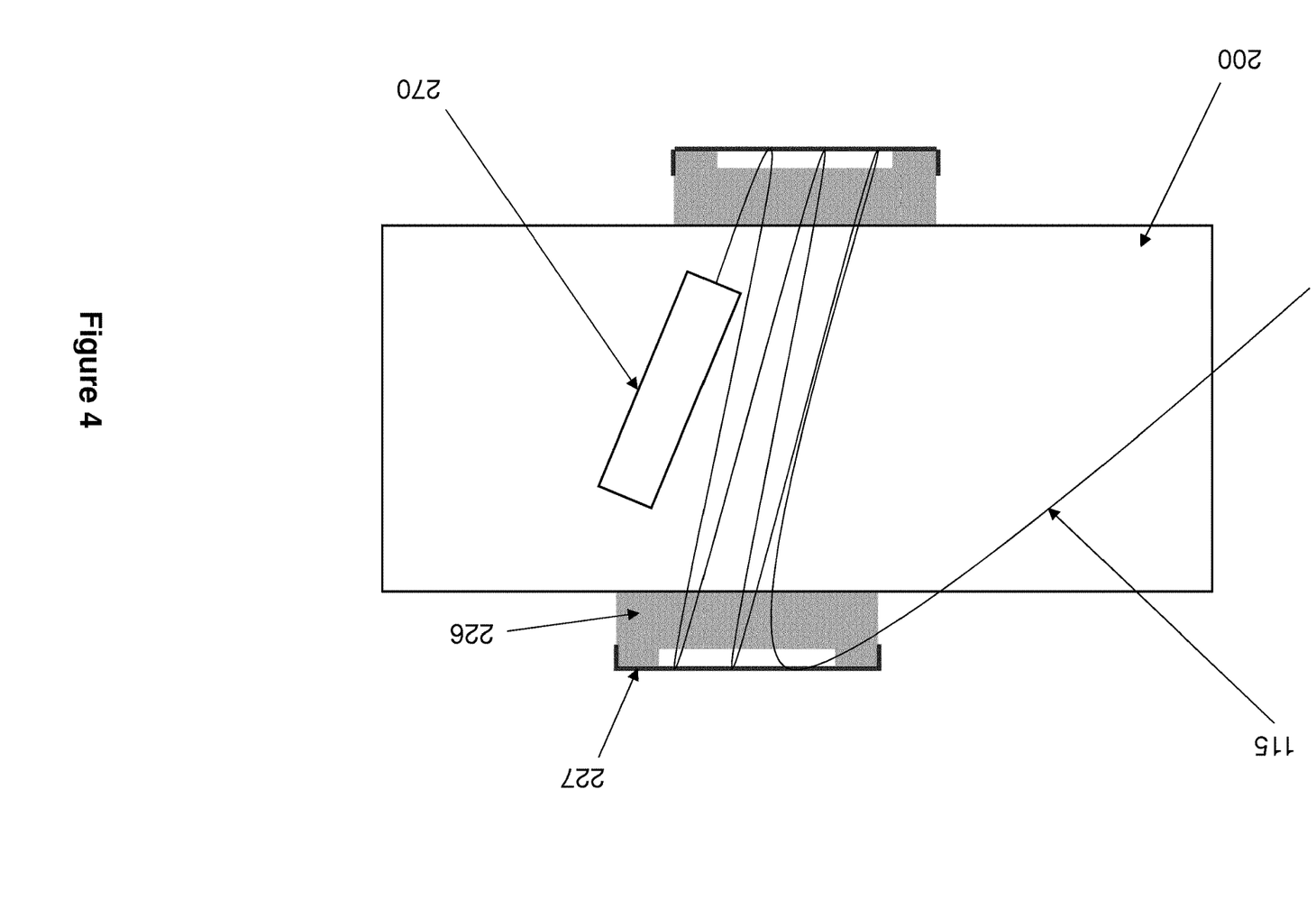
FIG. 4 shows a further schematic depiction of a network node according to the present disclosure.

FIG. 4 shows a further schematic depiction of a network node 200 according to the present disclosure, which shows how the fiber cable is managed. The fiber management apparatus 225 receives the fiber cable 115, which is then looped around the external periphery of the node. The fiber management apparatus may comprise a first element 226 in which a channel has been formed and a second element 227 which covers the channel in the first element. The first element will comprise an aperture such that the fiber cable (or fiber element extracted from the fiber cable) can be received by the optical terminator 270.

Figure 5:
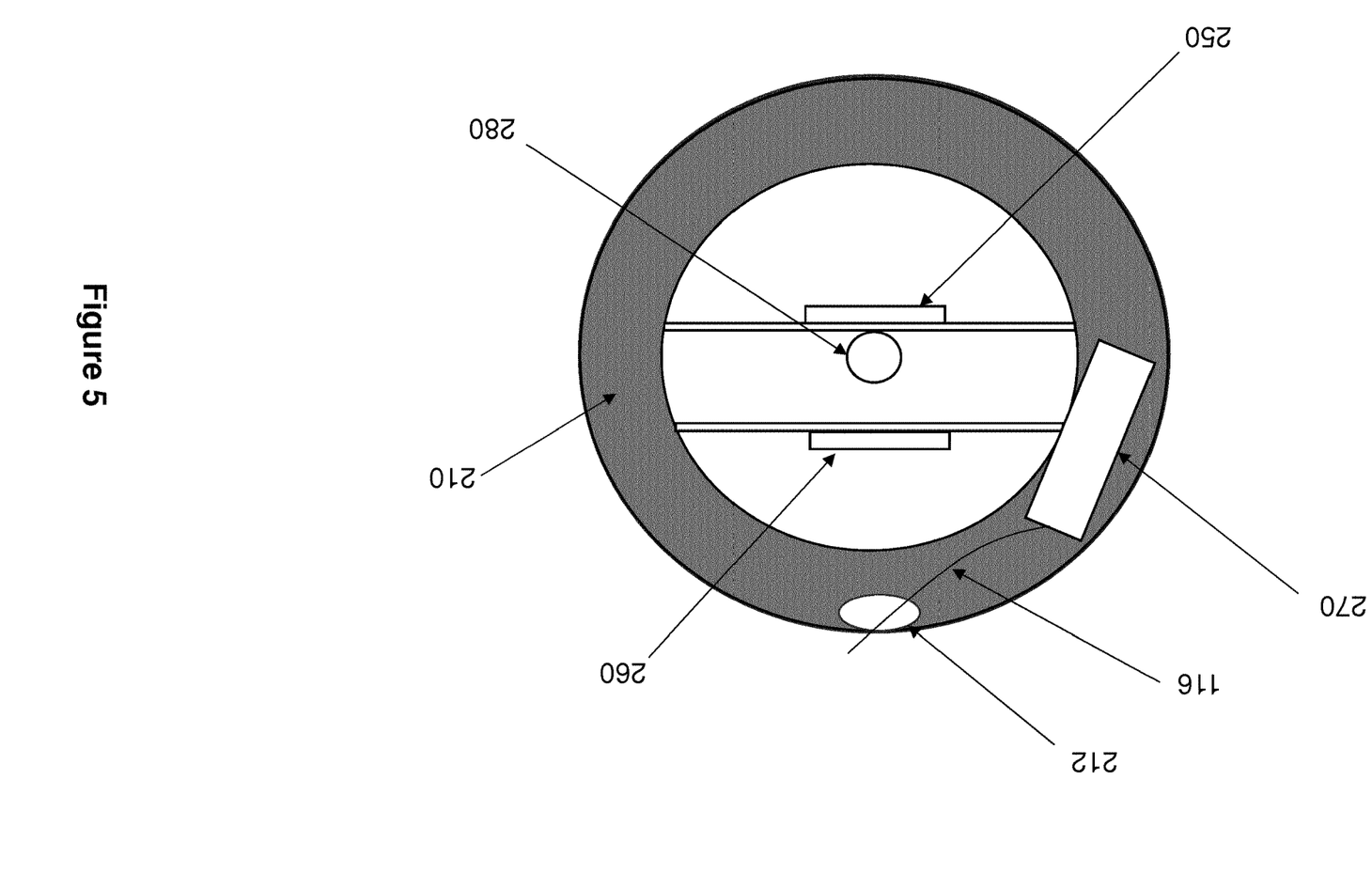
FIG. 5 shows a schematic depiction of a cross-section across the length of a network node according to the present disclosure.

FIG. 5 shows a schematic depiction of a cross-section across the length of a network node according to the present disclosure, showing the cable port 212 formed in the body 210 of the node 200, and an optical fiber 116 being connected to the optical terminator 270. The heat sink 280 is shown as being adjacent to the VDSL chip set 250 but it will be understood that the size of the heat sink and/or the position of the RPF circuit 260 could be varied such that the heat pipe is adjacent to both the VDSL chip set 250 and the RPF circuit 260.

In operation, packet data Ethernet packets will be received over the optical terminator from the optical fiber cable, converted to electrical signals and routed to the appropriate DSL modem port. The electrically modulated date electrical signal will then be transmitted over the copper pair associated with that port in the output metallic cable such that the electrical signal is received by a standalone single channel VDSL modem (not shown) which is located in a respective customer premises. Similarly, modulated electrical DSL packet data received from a copper pair in the output metallic cable will be converted into a data packet by the DSL chipset and then after routing and electrical/optical conversion will be transmitted via the optical fiber cable back to the telephone exchange.

The VDSL chipset requires a source of electrical power in order to operate and in order to avoid the need to provide a separate electrical power supply, the RPF circuit can receive electrical power from one or more of the copper pairs in the output metallic cable. The VDSL modems in the customer premises can be adapted in order to generate the required electrical power signals. Such reverse power feed systems are well known, and can be compliant with ETSI TS 101 548 V2.1.1. The limited space within the node is likely to preclude the use of a backup battery in the event that the reverse power feed is disrupted. However, if space does permit then a battery or storage capacitor may be provided in the node. It may also be possible to supply power to the VDSL chipset using one or more copper pairs in the input metallic cable, for example as described in EP 2 140 675.

The VDSL chipset and the RPF circuit will both generate excess heat, which will need to be controlled in order to prevent damage from occurring. A heatsink 280 is provided to mitigate this problem. The heatsink may take the form of a heatpipe which extends along the length of the network node. Furthermore, the heatpipe may be thermally coupled to one or more of the first and second end faces 220 230, such that the one or more end faces act as a heat sink which is external to the network node. The first and/or the second end face may be formed from a metallic material, or some other material which would act as an efficient thermal conductor. The thermal coupling between the heat pipe and the end face(s) may comprise a thermal paste. Due to the potential issues caused by excessive heat within the node it is preferred that the VDSL chipset and the RPF circuits are designed to have a low power consumption, which may include the use of VDSL2 low power modes.

The installation of a node according to the present disclosure can be accomplished by cutting an existing cable in a copper access network and connecting the two ends of the cables to the node. The copper pairs in each of the cables can be connectorized such that the connectors can be connected to the node, which can comprise appropriate connectors. Initially, the node will be passive such that existing PSTN and other exchange-based signals (such as, for example, ADSL signals) pass through the node. Once the node has been connected to the fiber cable 115 and the node receives power from one or more copper pairs then the VDSL chipset is able to operate as described above. It will be understood that in the event of the node failing it is relatively easy to replace it in the field, rather than seeking to repair the node or a component of the node. The copper cables and the fiber cable can be disconnected from the failed node and then connected to a replacement node.

As noted above, the network node is for use with a relatively small number of customer lines where the deployment of a conventional VDSL cabinet cannot be justified economically. Thus, the input and output copper cables will have a relatively small number of copper pairs, for example 10-20 pairs. This means that the node should have a small size such that it can be readily installed, as described above, into existing footway or junction boxes or even on a telephone pole. Thus, the use of the network node does not require the provision of any additional infrastructure, in contrast to the deployment of a conventional cabinet. As the installation of a network node according to the present disclosure is decoupled from the provision of further infrastructure then the node should be installed as near to the customer premises as possible, in order to decrease the length of copper cabling over which the VDSL signals are carried such that the data rates provided to the customer are as high as possible.

The above description makes reference to only a single input metallic cable and an output metallic cable. Although the use of vectoring to reduce crosstalk and increase data rates make it advantageous to use only a single input and output metallic cables, it should be understood that a network node according to the present disclosure could be used in conjunction with one or more input metallic cables and/or one or more output metallic cables.

It will be understood that multiple nodes may be located near to each other, for example in the same footway box, such that multiple copper cables will be running parallel to each other in the same duct. In such situations it is possible that signals in a first copper cable can cause crosstalk in a second copper cable. Thus, the node may comprise further vectoring components such that the effects of crosstalk are minimized or eliminated. Furthermore, the vectoring components of one node may be able to share vectoring data with other nodes so that vectoring can be performed in a distributed manner for all the cables in a single duct. A communications link will need to be provided to interconnect the nodes, which may comprise a copper or optical fiber interconnect cable or alternatively a wireless signal, for example Bluetooth.

It should be understood that the foregoing references to VDSL should be interpreted to include VDSL, VDSL2, G.fast and other equivalent or similar data transmission protocols or technologies.

According to one aspect, the present disclosure provides a network node for use in a hybrid fiber-copper access network, wherein the node comprises DSL and reverse-power feed functionality. The node has a substantially cylindrical shape such that it receives an input metallic cable at a first end, an output metallic cable at a second end and an optical fiber cable which is received at a point along the body of the node.

The invention claimed is:

1. A network node for deployment in an access network, the network node having a substantially cylindrical shape and comprising:
a first end configured to receive an input metallic cable;
a second end configured to receive an output metallic cable;
a port configured to receive an optical fiber cable, the port being located intermediate the first end and the second end of the network node;
a power circuit configured, in use, to receive an electrical power supply from the output metallic cable;
a digital subscriber line transceiver configured, in use, to receive optical data signals from the optical fiber cable and to transmit electrical data signals on the output metallic cable; and
a heat sink comprising a heat pipe which extends along a length of the network node.

2. The network node according to claim 1, wherein the network node further comprises a fiber management apparatus, the fiber management apparatus being arranged around a periphery of the network node.

3. The network node according to claim 1, wherein the heat sink further comprises one or two end caps, the one or two end caps being located at a respective end of the network node and being configured, in use, to be thermally coupled to the heat pipe.

4. The network node according to claim 1, wherein the digital subscriber line transceiver is further configured, in use, to receive electrical data signals from the output metallic cable and to transmit optical data signals from the optical fiber cable.

5. The network node according to claim 1, wherein the network node is configured to receive at least one of: one or more input metallic cables, or one or more output metallic cables.

6. A communications network comprising:
one or more network nodes for deployment in an access network, the one or more network nodes having a substantially cylindrical shape and comprising:
a first end configured to receive an input metallic cable;
a second end configured to receive an output metallic cable;
a port configured to receive an optical fiber cable, the port being located intermediate the first end and the second end of the network node;
a power circuit configured, in use, to receive an electrical power supply from the output metallic cable;
a digital subscriber line transceiver configured, in use, to receive optical data signals from the optical fiber cable and to transmit electrical data signals on the output metallic cable; and
a heat sink comprising a heat pipe which extends along a length of the network node.

* * * * *